US008418110B2

(12) United States Patent
Keinert et al.

(10) Patent No.: US 8,418,110 B2
(45) Date of Patent: Apr. 9, 2013

(54) USING PORT OBSCURITY FACTORS TO IMPROVE ROUTING

(75) Inventors: Joachim Keinert, Altdorf (DE); Thomas Ludwig, Sindelfingen (DE)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 12/875,081

(22) Filed: Sep. 2, 2010

(65) Prior Publication Data

US 2012/0060139 A1   Mar. 8, 2012

(51) Int. Cl.
*G06F 17/50* (2006.01)
(52) U.S. Cl.
USPC ............ 716/126; 716/100; 716/103; 716/110
(58) Field of Classification Search .................... 716/126
See application file for complete search history.

(56) References Cited

U.S. PATENT DOCUMENTS

| 5,587,923 A * | 12/1996 | Wang ............................. 716/129 |
| 6,353,918 B1 * | 3/2002 | Carothers et al. ............. 716/129 |
| 7,657,860 B1 | 2/2010 | Brashears et al. |
| 2004/0040007 A1 * | 2/2004 | Harn ............................. 716/11 |
| 2006/0242614 A1 | 10/2006 | Wadland et al. |

* cited by examiner

*Primary Examiner* — Paul Dinh
*Assistant Examiner* — Bryce Aisaka
(74) *Attorney, Agent, or Firm* — Brevetto Law Group (57) ABSTRACT

An integrated circuit characterized by a netlist may be routed using a routing priority list that may be created using port obscurity factors. A port obscurity factor may indicate how difficult it may be to route to that port and may be calculated as being inversely proportional to the number of routing tracks that may be connectable to that port. Routing priorities for the nets of the netlist may then be created using the port obscurity factors of the ports in the net. Routing may then be done in the order determined by the routing priority list and the generated layout information stored in a computer useable medium. In some cases, routing may be performed using multiple routing passes where a new routing priority list may be calculated for each routing pass.

10 Claims, 5 Drawing Sheets

USING PORT OBSCURITY FACTORS TO IMPROVE ROUTING

BACKGROUND

1. Field of the Invention

The present subject matter relates to routing connections in an integrated circuit. More specifically, it relates to prioritizing nets before routing the integrated circuit.

2. Description of Related Art

An integrated circuit (IC) has a large number of electronic components that are created by forming layers of different materials and of different geometric shapes on various regions of a semiconductor. The design process for an IC, called the physical design process, transforms a circuit description into a geometric description called a layout.

Engineers often use electronic design automation (EDA) software tools to assist in the design process. A top-down design methodology is commonly employed using hardware description languages (HDLs), such as Verilog or VHDL for example, by which the engineer creates an integrated circuit by hierarchically defining functional components of the circuit, and then breaking down each component into smaller and smaller components.

The components of an integrated circuit are initially defined by their functional operations and relevant inputs and outputs. From the HDL or other high level description, the actual logic cell implementation is often determined by a logic synthesis tool, which converts the functional description of the circuit into a specific circuit implementation. The logic cells are then "placed" by giving them specific coordinate locations in the circuit layout, and "routed" by wiring or connecting logic cells together according to the designer's circuit definitions. The placement and routing software routines generally accept as their input a cell library and a netlist that has been generated by the logic synthesis process. This netlist, or list of nets, identifies the specific logic cell instances from the cell library, and describes the specific cell-to-cell connectivity.

SUMMARY

Various embodiments involve methods and systems for routing an integrated circuit design, characterized by a netlist that is executed on a processor. The method may include identifying the netlist to be routed. The netlist may include at least a first net and a second net. The nets each include a list of ports be electrically connected. A routing priority may be created for each net based on port obscurity factors of the ports in the nets. The nets may be routed in an order based on the routing priority of each net to create layout information and the layout information may be stored in a non-transitory computer usable medium.

Other embodiments involve a computer program product for routing an integrated circuit design. The computer program product may include a non-transitory computer readable storage medium having computer readable program code stored on it, the computer readable program code configured to implement the method described above.

Other embodiments involve methods for prioritizing routing of an integrated circuit design, characterized by a netlist that is executed on a processor. The method may include identifying the netlist to be routed. The netlist may include at least a first net and a second net. The nets each include a list of ports be electrically connected. A routing priority may be created for each net based on port obscurity factors of the ports in the nets. The routing priorities may then be stored on a computer usable medium.

BRIEF DESCRIPTION OF THE SEVERAL VIEWS OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

In the following detailed description, numerous specific details are set forth by way of examples in order to provide a thorough understanding of various embodiments. However, it should be apparent to those skilled in the art that the embodiments of the present disclosure may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Some descriptive terms and phrases are presented in the following paragraphs for clarity.

A cell library is a computer readable file or database including information about individual predesigned cells, or circuit elements, which may be used in an integrated circuit (IC) design. Information included in the cell library for each cell may include size and shape of the cell, location of the ports of the cell, electrical characteristics, and physical design information, but not all the listed information may be included in every cell library for every cell and other information may be included in some cell libraries.

A cell is a pre-designed circuit element to be used in an IC design. Cells may describe a wide array of different circuit elements including, but not limited to, such elements as transistors, logic gates, gates, flip-flops, buffers, I/O drivers and other low level circuit elements as well as higher level constructs such as register banks, arithmetic logic units, memory arrays, central processing unit (CPU) cores and other circuit blocks.

A port is an input or an output of a cell. Ports may be defined as a specific metal layer(s) in a specific geometric location in the cell.

A placement file is a computer readable file or database describing specific instances of cells from a cell library and providing physical location information about where each instance of a cell is to be located on the IC. In some embodiments, the placement file may be included as part of netlist.

A list of nets, sometimes called a netlist, is a computer readable file or database including information about how specific ports of specific instances of a cell are to be electrically connected. A netlist can be thought of as a computer representation of one physical embodiment of the IC design.

A net is group of ports of specific instances of cells that are designed to be electrically connected. Each port that is included in a net may sometimes be referred to as a node of the net.

A path is a physical electrical connection between nodes in a net. A path may be made up of specific geometric shapes, such as rectangles, on a specific metal layer of the IC and vias. The individual geometric shapes may overlap on a single layer to connect or they may be connected by a via if the geometric shapes overlap but are on different metal layers. A full path from one node to another node may be referred to as a route.

Routing refers to the process of determining how to best place the geometric shapes to create a path (or route) for a list of nets (or netlist). Many different techniques and procedures for routing may be well known to one skilled in the art and the details are not discussed in detail in this disclosure.

Layout information is a computer file or database describing the physical design of an IC including the placement of the instances of the cells and paths connecting the ports of the cell instances. Layout information can be thought of as a computer representation of another physical embodiment of the IC design.

In the inventor's experience, traditional routing programs use area-based routing techniques, which are a rigid two-staged process of first performing global routing on an area followed by detail routing upon that same area. A global router does not normally make any specific connections, but provides a general plan for making the connections. During detail routing, the detailed router determines the exact location and layers for each interconnect, based upon the set of design rules that have been provided to the chip designer. One problem that such a traditional approach may not address is that routing access to all ports of a library element is not always guaranteed. The router has no knowledge about limited port access and it has no capability to route ports with limited access first so sometimes ports may be inadvertently blocked during global routing, even before any attempt is made to connect that port at a detailed level. Traditional routing programs don't use information about the ports to prioritize the routing of nets, only the information in the placement and netlist are traditionally used by the routing program. Even if the cell library would be consulted, typically, the cell library contains no information designed to help the router explicitly.

The embodiments herein described may improve routability of very large scale integration (VLSI) integrated circuit (IC) designs by assigning obscurity factors to ports of cells. A port obscurity factor may be thought of as the priority that a port should have for routing purposes so the higher the port obscurity factor, the earlier that port should be routed. The port obscurity factors may then be used to create routing priority lists where nets connecting ports having high obscurity factors may be given a high priority and routed before nets connecting ports with low obscurity factors. Available routing methods may be modified to use priorities on nets so high priority nets can be routed first to achieve a better routability. These priorities can be assigned on nets known to have routability problems. In the inventor's experience, most routing today is done with no prioritization or with priority based on a manual process using heuristics and manual library inspection.

Reference now is made in detail to the examples illustrated in the accompanying drawings and discussed below.

Figure 1:
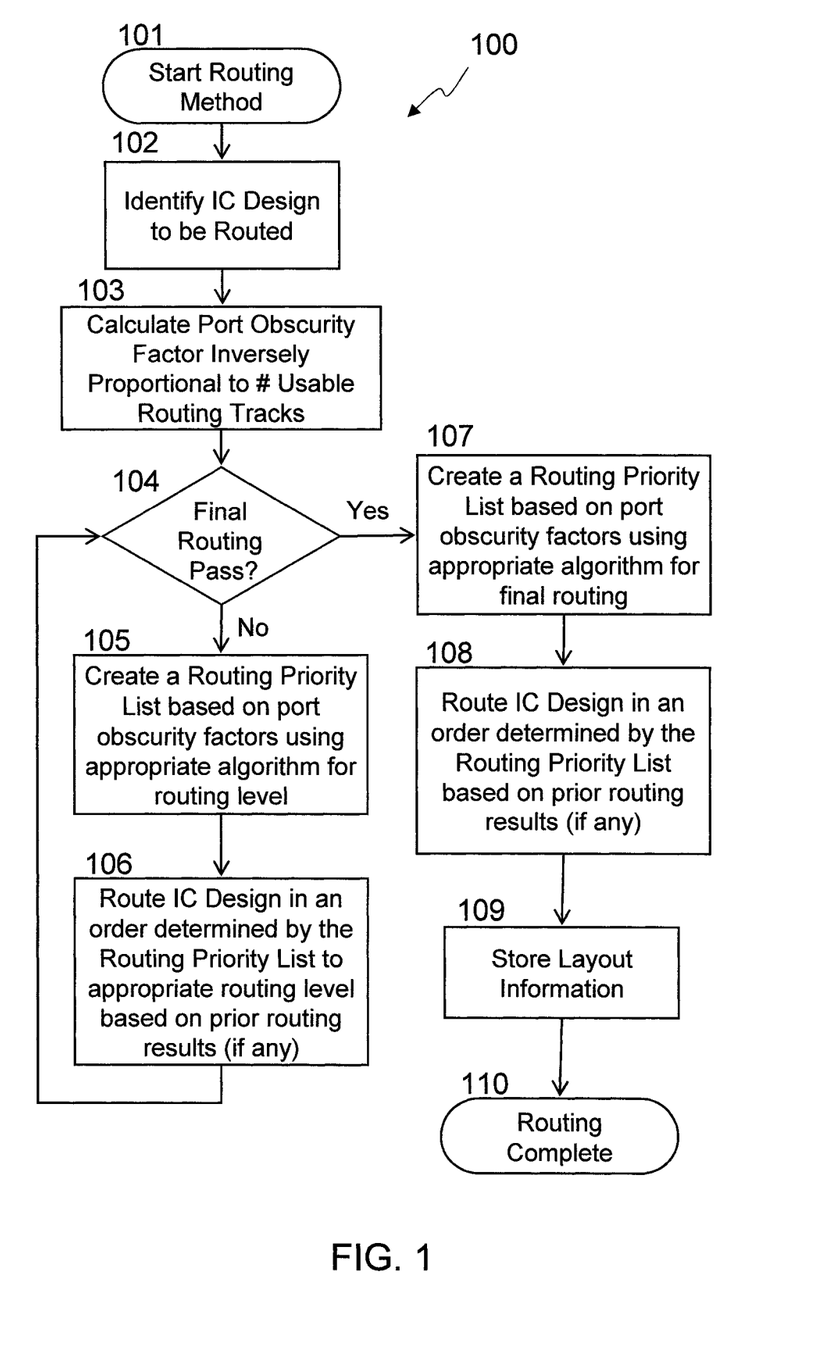
FIG. 1 is a flowchart depicting an embodiment of a method for routing an integrated circuit design using port obscurity factors.

FIG. 1 shows a flowchart 100 depicting an embodiment of a method for routing an integrated circuit design using port obscurity factors to help alleviate some of the problems listed above. Routing may be started at block 101 when a user initiates the routing tool on a CAD workstation or other processor based device. An integrated circuit design to be routed may be identified at block 102. The integrated circuit (IC) design may be identified based on a user input, a file name in an instruction file (or make file) stored on the computer, a parameter passed from another computer program, or any other method for identifying the IC design to be routed to the routing tool. The IC design may include references to a target cell library or libraries describing the details of the individual circuit elements to be used by the IC. The IC design may also include a placement file listing all the instances of cells from the cell library to be used by the design and describing where the instances of the cells should be located in the IC. The IC design may also include a list of nets to be routed, or a netlist, with each net describing all the ports of various instances of cells of the cell library to be connected. At block 103, port obscurity factors may be calculated for the ports of the cells in the cell library. In some embodiments, the port obscurity factors may have been pre-calculated and stored in the cell library with the cells. In other embodiments, the port obscurity factors may have been pre-calculated and stored in a separate port obscurity factors file. In other embodiments, the port obscurity factors may be calculated within the router tool and in other embodiments, a separate tool may be used to calculate port obscurity factors. The calculated port obscurity factors may be inversely proportional to the number of routing tracks that could be used to route connections to that port.

At block 104 it is determined if it is time for the final routing pass in a multi-pass routing process. If it is not the final pass, the method may proceed to block 105 to create a routing priority list. The routing priority list may be created by calculating a routing priority for each net in the netlist. A different calculation may be made for routing priorities depending on which routing pass is being performed. In one embodiment, the routing priority for a net may be calculated by summing the port obscurity factor for each port connected in that net. In another embodiment, the routing priority may be determined by the highest obscurity factor of any port connected to that net. Some embodiments may use an additional factor, such as a placement density factor, in calculating a routing priority. A placement density factor might be determined by calculating the percentage of area actively used in a cell. In another embodiment, the placement density factor might be calculated by dividing the number of ports of a cell by the area of that cell. If a placement density factor is used it might be multiplied with the port obscurity factor, averaged with the port obscurity factor or used in a "maximum" function to determine the value to use in the routing priority for a particular port. Any set of calculations may be used to create the routing priority list. Routing the IC design is performed at step 106. The routing priority list may be sorted in descending order to determine the order that nets should be routed for that routing pass. Each routing pass uses the output of the previous routing pass (if any) as a starting point and may create more detailed routing information with each pass. In some embodiments, a routing pass may find it necessary to undo some of the routing of a previous routing pass, but in general, each routing pass may route the design to a greater level of detail.

After each non-final routing pass, a check is made in block 104 to determine if the next pass will be the final routing pass.

For the final routing pass, a final routing priority list is created in block 107. In some embodiments, routing may be done in a single pass so that only this sequence through the flow chart is used and blocks 105 and 106 are never used. The final routing priority list may be calculated in much the same way as previous routing priority lists for earlier routing passes. It may use the same calculations or it may use different calculations for determining the routing priority for each net. In some embodiments, such as those that might use a single pass router, the routing priority list may be stored on a computer useable medium and the method ended, so that a separate routing program that may be priority aware may be run at a future time. From some multi-pass embodiments, the final routing priority list may be calculated separately for each port of each net in the netlist and routing done in the order determined by sorting the final routing priority list so that each port is routed separately in final priority order independent of which net it is a part of. In such embodiments, the final local routing may not take place for all ports of a single net before the router proceeds to the next net. Each port may be routed individually based on the partial routing results of the previous pass(es), starting with the port with the highest obscurity factor of any port in the entire IC design and then moving down the priority list, port by port. At block 108 final routing is performed in an order determined by sorting the final routing priority list. The final routing pass, like earlier routing passes may use the output of the previous routing pass (if any) as a starting point for its more detailed routing. The final routing pass may create a final route with each port of each netlist connected with specific physical geometric shapes on one or more layers of the IC and vias to connect between individual layers at specific points. This specific physical geometry for each layer may be called the layout information. The embodiment of the method described in FIG. 1 transforms a wiring list that could be thought of as a description that could be implemented by a set of individual insulated point-to-point wires to a set of structured layers of wiring, with insulation between each layer and defined connections between layers. The layout information is stored on a computer useable medium at block 109 and the routing method is completed at block 110.

Figure 2:
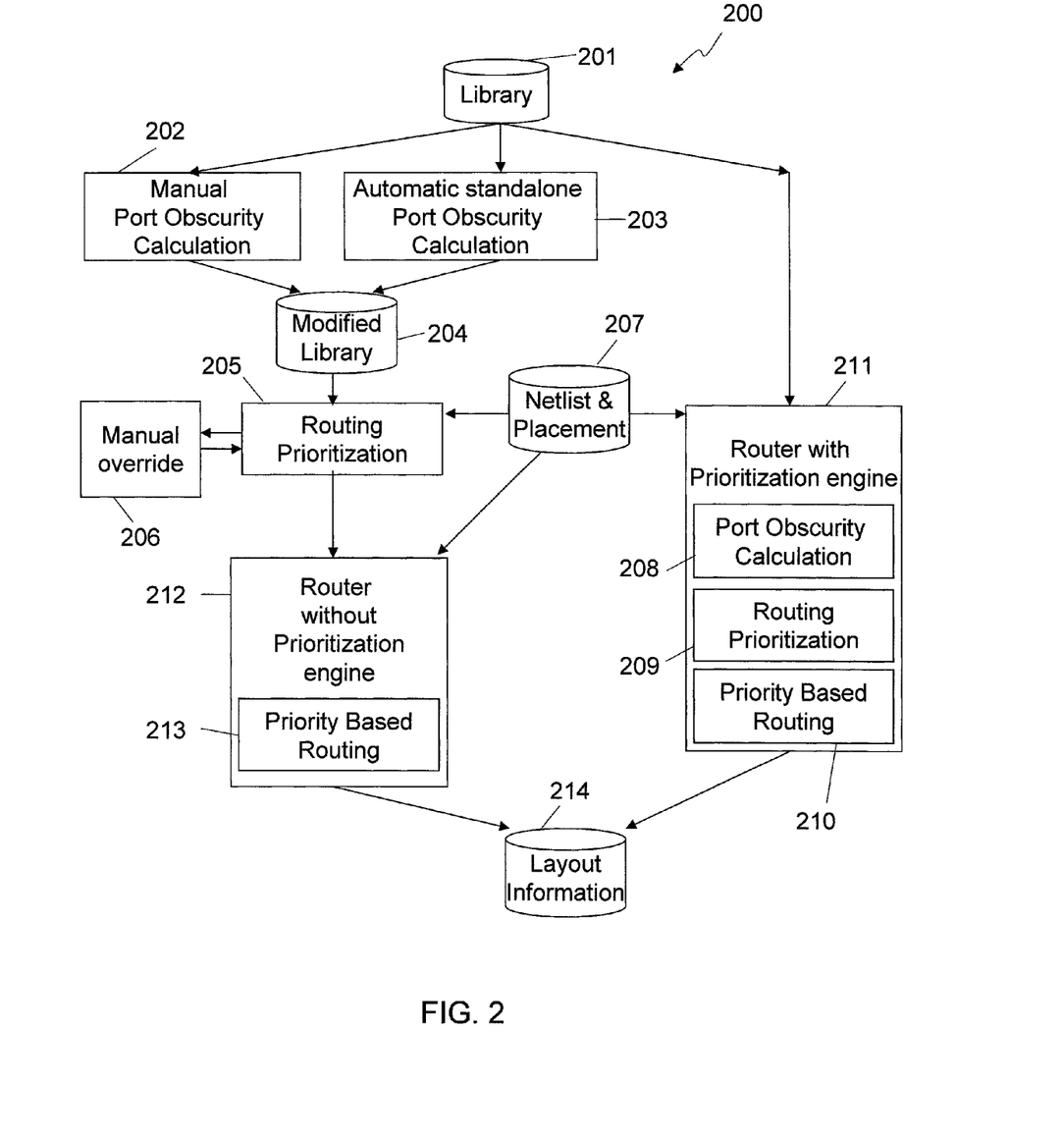
FIG. 2 depicts design flows for various embodiments of routing an integrated circuit.

FIG. 2 depicts design flows 200 for various embodiments of routing an integrated circuit as described in FIG. 1. A library 201 of cells may be stored on a computer readable medium. The library 201 may have physical and electrical information about each cell in the library 201, including physical layout information describing how the ports of that cell may be able to connect to the various wiring layers of an IC. In some embodiments, a user may manually assign 202 an obscurity factor to each port of a cell in library 201 and store that obscurity factor information in a modified library 204. In other embodiments, a computer program may utilize the information in the cell library to automatically assign 203 an obscurity factor to each port of the cell and store the results in the modified cell library 204. In some embodiments, a prioritizing router 211 with an engine for calculating the obscurity factor of a port may be utilized. The prioritizing router 211 may retrieve information from the cell library 201 as well as the netlist and placement 207. It may then automatically calculate a port obscurity factor 208 for each port of the instantiated cells and then create a routing prioritization 209 before routing 210 the netlist. Some embodiments may not include calculation of port obscurity factors as a part of the prioritizing router 211 but may count on port obscurity factors being stored as a part of a modified cell library 204. If the router 210 is a multi-pass router, a new routing prioritization 209 may be created for each pass of the router 210. Once routing 210 has been completed, the layout information 214 created may be stored in a computer useable medium. In other embodiments, the router 212 may not include a prioritization engine. For those embodiments, a stand-alone routing prioritization 205 may be required. The stand-alone routing prioritization 205 may retrieve the modified library 204 and the netlist 207 to create routing prioritization. In some embodiments, the stand-alone routing prioritization 205 may include calculation of port obscurity factors and access the cell library 201 without port obscurity factor included. In some embodiments, a user may manually override 206 some of the routing prioritization 205 information to force a particular order of routing so that critical nets may be routed first even if their calculated routing priority is not high. Once the routing prioritization 205 has been completed, a router 212 using priority based routing 213 may be run at a later time and store the layout information 214 in a computer useable medium.

Figure 3A:
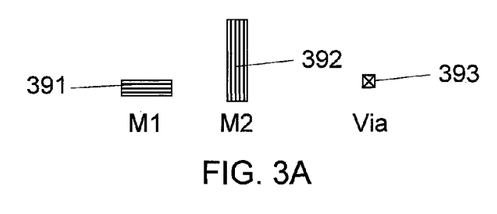
FIG. 3A is a key for symbols used in FIGS. 3B, 3C, 3D, and 3E.
Figure 3B:
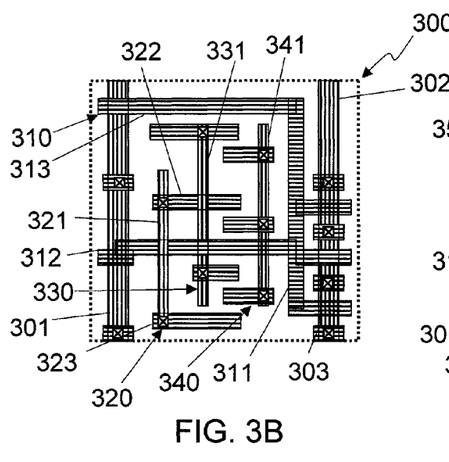
FIGS. 3B, 3C, 3D, and 3E depict various embodiments of calculating port obscurity factors for a library cell.
Figure 3C:
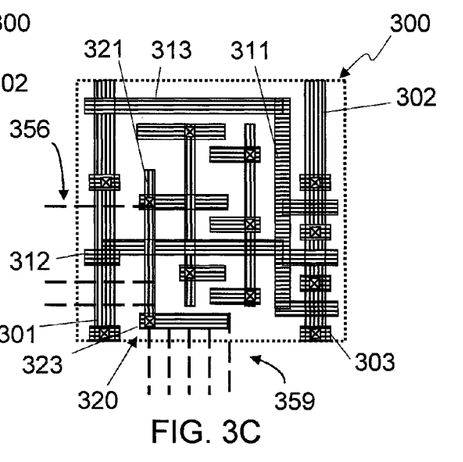
Figure 3D:
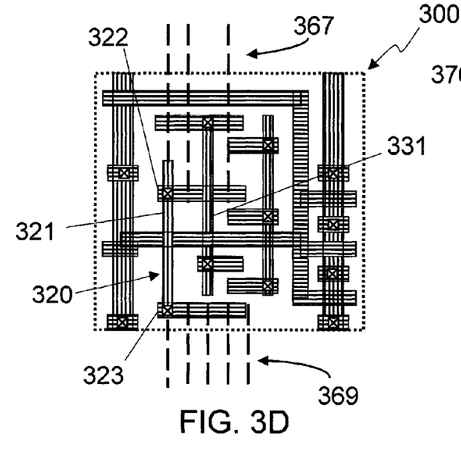
Figure 3E:
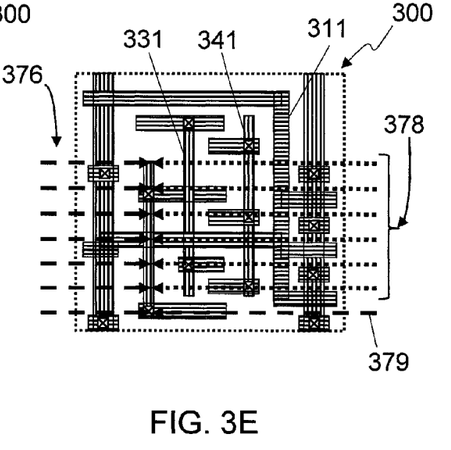

Turning now to FIG. 3A-3E, more detail for embodiments of calculating port obscurity factors of the ports of a cell are described. FIG. 3A is a key for symbols used in FIGS. 3B, 3C, 3D, and 3E. Rectangle 391 shows the horizontal cross-hatching used to show elements using the metal 1 layer (M1). Rectangle 392 shows the vertical cross-hatching used to show elements using the metal 2 layer (M2). The via symbol 393 is used to show where rectangles in M1 and M2 are connected together. FIG. 3B shows a cell 300 with one output port 310, a first input port 320, a second input port 330, and a third input port 340. The cell 300 also has power connections 301, 302 utilizing M2 with multiple stubs of M1 on the right and left sides of the cell 300 including M1 rectangle 303. The output port 310 of this embodiment is entirely composed of M1 rectangles including rectangle 311, rectangle 312 and rectangle 313 as well as a rectangle connecting rectangle 311 with rectangle 312 and three rectangles extending to the right of rectangle 311. The first input port 320 includes rectangle 321 in M2 connected to rectangle 322 and rectangle 323 in M1. The second input port 330 includes rectangle 331 in M2 as well as two connected rectangles in M1 and the third input port 340 includes rectangle 341 in M2 as well as three connected rectangles in M1. FIGS. 3C, 3D, and 3E show the same cell 300 but are used to depict various embodiments of calculating port obscurity factors for a library cell.

A port obscurity factor may be calculated by evaluating the routing tracks that may be used to connect to a particular port of a cell. To force ports that may be difficult to route to be routed earlier, a port with fewer routing tracks that may be used to connect to that port may be given a higher obscurity factor than those ports with more routing tracks that may be used. The metal layers of the port (M1 and M2 for the first input port 320 of FIG. 3B-3E) as well as adjacent metal layers may be evaluated for routing tracks to use. Some embodiments may evaluate even more layers in calculating port obscurity factors. To evaluate what routing tracks may be used, a routing grid for each routing layer to be evaluated, using the design rules for that layer, may be projected onto the cell. In one embodiment, the ports of the cell may be temporarily modified for the evaluation by merging the port geometry from other layers used by the port into the layer being evaluated, and expanding each port shape by half the minimum design rule for that layer, before projecting the routing grid onto that layer. Then the number or routing tracks that intersect the port on that layer may be counted. Any non-port shapes that intersect a routing track on that layer subtract that track from the total to determine the number of usable routing tracks for that port in that layer. In some embodiments, "Manhattan" routing tracks, or only vertical and horizontal routing tracks, may be used; while other embodiments may consider other routing tracks such as diagonal tracks. Layers above and below may also be evaluated. Some embodiments may consider routing tracks on all 4 sides of a cell for local routing layers while using only normal wiring directions for non-local metal layers. Other embodiments may consider all 4 sides of the cell for all routing layers or may not consider all 4 sides for the local routing layers.

In some embodiments, if a routing track crosses another port on a different layer before intersecting the port being evaluated, that track may be considered a shared track. All shared tracks should be divided by the number of ports that may be able to use that track before being added to the sum of usable tracks. Some embodiments may only consider tracks shared if they are adjacent to the port layers (e.g. M3 track crossing over a M2 element counts as shared but a M3 track crossing over a M1 element may not count as shared). The sum total number of tracks that may be used for a port (including the partial sums for shared tracks) may be referred to as a port accessibility factor. A port obscurity factor may be calculated that is inversely proportional port accessibility factor. One embodiment subtracts the port accessibility factor from a constant to derive the port obscurity factor and in one embodiment that constant may be zero and in another embodiment that constant may be the maximum port accessibility factor of any port of the cell library, although any constant could be used. Another embodiment uses the port accessibility factor as a divisor for a positive constant. In one embodiment that constant may be "1" and in another embodiment that constant may be the maximum port accessibility factor of any port of the cell library, although any positive number could be used as the constant. Any calculation may be used that provides a port obscurity factor that provides an indication of how difficult it may be to route to that port, such as any calculation that provides a number inversely proportional to a port accessibility factor. FIG. 3C-3E are discussed below to illustrate an example of one such port obscurity factor calculation.

FIG. 3C shows the routing channels of M1 that may be used to connect to the first input port 320. According to one embodiment, the local routing layer, M1 in FIG. 3C, may be evaluated from all 4 sides to determine how many M1 routing tracks, according to the design rules for the design, might be used to connect to the first input port 320. Note that all M1 access from the top is blocked by rectangle 313 and from the right by rectangle 311. The M1 routing tracks that may be used to connect to the first input port 320 from the left are represented by the three dashed lines 356. All other M1 routing tracks from the left are blocked by either the M1 stubs connected to M2 rectangle 301 or rectangle 312 of the output port. To connect the left side M1 routing tracks to the first input port 320, vias may need to be used to connect to the M2 rectangle 321. The M1 routing tracks that may be used to connect to the first input port 320 from the bottom are shown as the five dashed lines 359 that all have direct access to rectangle 323 along the bottom edge of cell 300. So, in the embodiment shown, there are 8 M1 routing tracks that may be used to connect to the first input port 320.

The M2 routing channels that may be used to connect to the first input port are shown in FIG. 3D. In some embodiments access from all 4 sides of the cell may be considered for non-local routing layers and in other embodiments, only the sides that are perpendicular to the normal routing direction of a non-local routing layer may be considered. In the embodiment shown, M2 may be considered a non-local routing layer with a vertical normal routing direction although both sides are blocked by M2 rectangles 301, 302 so either treatment may arrive at the same answer in the example shown in FIG. 3D. The three dashed lines 367 show that three M2 routing tracks may be used to connect to the first input port 320 from the top of the cell 300. One routing track may be blocked by rectangle 331 of the second input port 330. To connect the top side M2 routing tracks to the first input port 320, vias may need to be used to connect to the M1 rectangle 322. In other embodiments, the M2 tracks accessing the first input port 320 may be considered shared ports as they first cross the output port 310 and the second input port 330. In those embodiments, the three tracks shown might be divided by 3 (depending on whether layers used in the port, or adjacent layers to the layer being evaluated, are considered in the shared port calculation) before being added to the total. But in the embodiment shown, metal layers used in the port are not considered for shared tracks. The dashed lines 369 show the five M2 routing tracks that may be used to connect to the first input port 320 from the bottom of the cell 300. To connect the bottom side M2 routing tracks to the first input port 320, vias may need to be used to connect to the M1 rectangle 323. So, in the embodiment shown, there are 8 M2 routing tracks that may be used to connect to the first input port 320.

FIG. 3E shows the metal 3 (M3) layer routing channels that may be used to connect to the first input port 320. Since M3 is a non-local routing layer with a horizontal normal routing direction, only M3 routing from the two sides may be considered in this embodiment. Other embodiments may consider routing from all 4 sides or non-orthogonal routing tracks. The seven routing tracks 376 on the left may be connectable to the first input port 320 and they do not cross over any other ports before crossing M2 rectangle 321 of the first input port 320 so they may not be considered shared tracks. M3 routing tracks from the right side may then be considered. One routing track 379 may access the first input port 320 without crossing any other ports and may be fully added to the useable track total. Six other routing tracks 378 may cross the M1 rectangle 311 of the output port 310, the M2 rectangle 341 of the third input port 340 and the M2 rectangle 331 of the second input port 330 before intersecting with the M2 rectangle 321 of the first input port 320. In some embodiments, these six tracks would be considered shared tracks. If the calculation uses port geometry two layers away from the layer being evaluated, the number of tracks would be divided by 4, as 1 output port and 3 input ports could use those tracks. In the embodiment shown, port geometry more than one layer away from the layer being evaluated are not considered for shared track evaluation so the number of tracks may be divided by 3, as there are 3 input ports that could connect to those M3 tracks from M2. So, in the embodiment shown there are 7+1+6/3=10 M3 routing tracks that may be used to connect to the first input port 320.

Completing the port obscurity factor calculation, the number of usable M1 tracks, usable M2 tracks and usable M3 tracks are added and then the sum is subtracted from a constant, 50 in this embodiment, to get a port obscurity factor that is inversely proportional with the number of routing tracks that may be connectable to that port. So the port obscurity factor for the first input port 320 of the embodiment shown may be calculated as 50−(8+8+10)=24. The port obscurity factor for the second input port 330 of the embodiment shown may be calculated as 50−(5+7+(2+14/2))=29 and the port obscurity factor of the third input port 330 of the embodiment shown may be calculated as 50−(4+6+(2/2+6/3+8))=29.

Figure 4A:
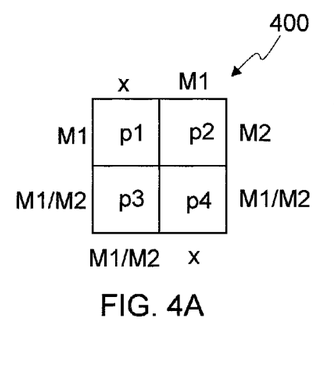
FIGS. 4A and 4B depict elements of an integrated circuit design to be routed.
Figure 4B:
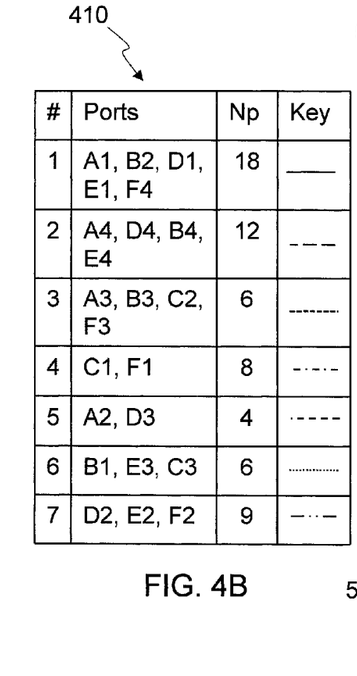

Referring now to FIGS. 4A and 4B, FIG. 4A depicts a cell 400 from a cell library showing key parameters of that cell and FIG. 4B depicts a netlist 410, both of which may be elements of an IC design to be routed. It should be noted that cell 400 is not the same as cell 300 of FIGS. 3A-3E and the detailed discussion of that cell does not directly apply to cell 400 of FIG. 4A. The cell 400 has 4 ports, port 1 in the upper left, port 2 in the upper right, port 3 in the lower left and port 4 in the lower right. Port 1 may be accessed only from the left using M1 with no access from the top. Port 2 may be accessed using only M1 from the top and only M2 from the right. Port 3 may be accessed using either M1 or M2 from either the left or the bottom, and port 4 may be accessed using only M1 or M2 from the right but may not be accessed from the bottom. So using a simple port obscurity factor calculation of port obscurity factor Po=5−#tracks, the port obscurity factor for port 1 is 5−1=4, the port obscurity factor for port 2, the port obscurity factor for port 3 is 5−4=1, and the port obscurity factor for port 4 is 5−2=3.

The netlist 410 shown in table form in FIG. 4B has 7 nets connecting 6 instantiations, A-F, of the cell 400. The net identifier is shown in the first column with a heading of "#". The second column with a heading of "Ports" lists ports of cell instances that may be connected in that net. For example, net6 connects port 1 of cell instance B to port 3 of cell instance E and to port 3 of cell instance C. The third column with a heading of "Np" gives the routing priority of the net. The routing priority for each net may be calculated by simply adding the port obscurity factor as calculated above for each port connected to that net. So as an example, the routing priority for net3 is 1+1+3+1=6. The fourth column with a heading of "Key" shows the line pattern used for that net in FIGS. 5A and 5B. Once the routing priorities have been calculated, the netlist may be sorted in decreasing priority order to determine the order in which the nets should be routed. For the netlist 410 shown, the priority order might be net1, net2, net7, net4, net3, net6, net5. While not shown in the netlist 410, it is possible that some nets may include only a single port. Since such nets require no routing, they have no effect on the product of the embodiments described herein. No routing priority need be calculated for nets including only a single port and such nets need not be included in lists of routing priority.

Figure 5A:
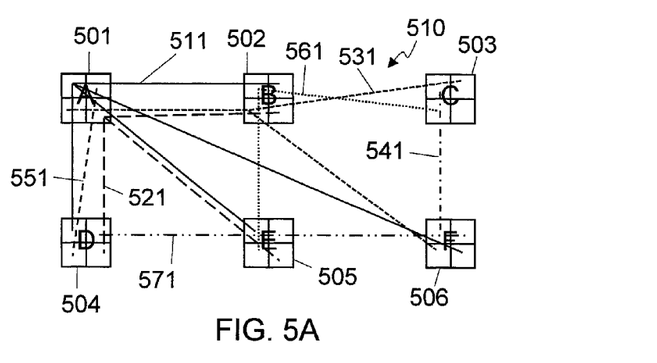
FIGS. 5A, 5B and 5C depict various routing stages from a multi-stage routing method.
Figure 5B:
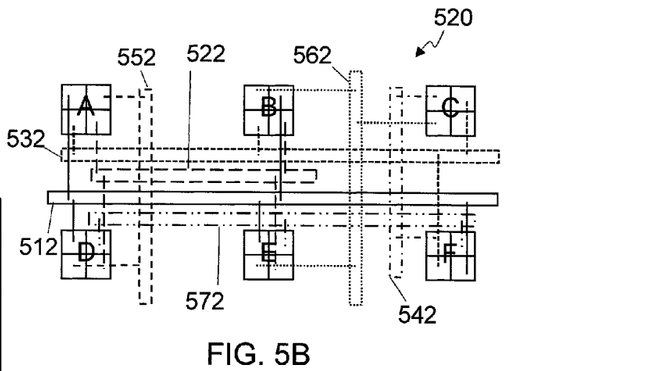
Figure 5C:
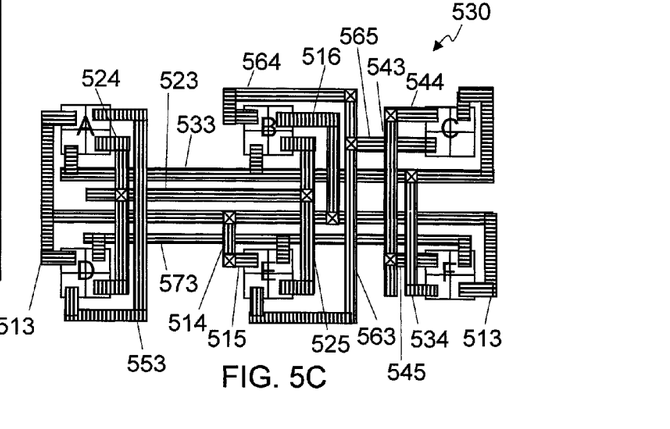

FIGS. 5A, 5B and 5C depict various routing stages from a multi-stage routing method for one particular instance of an IC design to be routed. FIG. 5A can be thought of as a direct graphical representation 510 of the netlist 410. The six instances of cell 400 labeled A-F may be placed according to a placement file which may be a part of an IC design to be routed. Instance A 501, instance B 502, instance C 503, instance D 504, instance E 505 and instance F 506 may be placed as shown in FIG. 5A. The seven nets are shown with direct line-of-sight routing. Net1 511 connects A1, B2, D1, E1, and F4. Net2 521 connects A4, D4, B4, and E4. Net3 531 connects A3, B3, C2, and F3. Net4 541 connects C1 and F1. Net5 551 connects A2 and D3. Net6 561 connects B1, E3, and C3 and net7 571 connects D2, E2, and F2. The graphical representation 510 can be thought of as a physical routing with each wire self-insulating and able to connect any two points without shorting to anything along its length. So the netlist, along with the placement file, is a representation of one physical embodiment of the IC design to be routed.

FIG. 5B shows a graphical representation 520 of an incomplete routing as might be found after a first routing pass of a two pass routing method. The six cell instances A-F have not moved from the graphical representation 510 of FIG. 5A but the representation of the nets 511, 521, 531, 541, 551, 561, 571 has been transformed to a hybrid representation with some physical routing included. According to the embodiment, the nets are routed in a priority order as shown above and leading to the following configuration. Net1 511 has one horizontal M1 routing track 512 predefined. Net2 521 has a horizontal M1 routing track 522 predefined. Net7 571 has one horizontal M1 routing track 572 predefined. Net4 541 has a vertical M2 routing track 542 predefined. Net3 531 has a horizontal M1 routing track 532 predefined. Net6 561 has one vertical M2 routing track 562 predefined and net5 551 has one vertical routing track 552 predefined.

A full layout 530 of the IC design after final routing is shown in FIG. 5C. The same cross hatching as shown in FIG. 3A is also used for FIG. 5C. The six cell instances A-F are still in the same locations but the netlists 511, 521, 531, 541, 551, 561, 571 have been transformed to a full physical layout implementable in a two layer metal IC fabrication process. Net1 connects to A1, D1 and F4 using M1 path 513 (occupying predefined routing track 512) which also connects to M2 path 514 and M2 path 516 through vias. M2 path 514 connects through a via to M1 path 515 which connects to E1. M2 path 516 connects to B2. Net2 uses the predefined M1 routing track 522 for M1 path 523 which connects to M2 paths 524, 525 through vias. M2 path 524 connects to A4 and D4 while M2 path 525 connects to B4 and E4. Net7 uses predefined M1 routing track 572 for M1 path 573 to connect to D2, E2 and F2. Net4 uses the predefined M2 routing track 542 for M2 path 543 which connects to M1 paths 544, 545 though vias. M1 path 544 connects to C1 and M1 path 545 connects to F1. Net3 uses predefined M1 routing path 532 for M1 path 533 that connects to A3, B3, C2 and M2 path 534 through a via. M2 path 534 connects to F3. Net6 uses predefined M2 routing track 562 for M2 path 563 that connects to E3 as well as M1 paths 564, 565 through vias. M1 path 565 connects to C3 and M1 path 564 connects to B1. Net5 uses predefined M2 routing track 552 for M2 path 553 which connects to D3 and to A2. So through the prioritized routing method, a point-to-point wiring implementation may be transformed to a two layer IC layout.

In one particular embodiment, three routing passes may be performed, with different routing prioritization calculated for each pass. In the first routing pass, referred to a as a global routing pass, a routing priority, Np, may be calculated for each net using the port obscurity factors of the cell ports Po and a placement density factor Pd which may be the number of ports of the cell divided by the area of the cell for some embodiments. For each net, the global routing priority may be calculated as the sum of the products of Po and Pd for each node of the net (Np=sum(Poi*Pdi) for i=1 to # anodes). Once the global routing priority list has been calculated for each net, the list may be sorted in descending priority order and the priority aware global router may route each net in priority order to an incomplete level of detail to create global routing information. For the next routing pass, an intermediate routing priority list may be created by calculating an intermediate routing priority for each net in the netlist. The intermediate routing priority for a net may be calculated as the largest product of the placement density factor and the port obscurity factor for each node in the net (Np=max(Poi*Pdi) for i=1 to #nodes). The intermediate routing priority list may then be sorted in descending priority order and the nets routed to an intermediate level of detail in an order determined by the sorted intermediate priority routing list using the global priority routing information as a starting point. A final routing pass may be performed. A final routing priority list may be created wherein a routing priority is calculated for each individual node in the netlist, not just each individual net. The final routing priority list may be calculated individually for each port in the netlist (not by net) as the sum of (a) the larger of the placement density factor and the port obscurity factor and (b) the mean of the placement density factor and the port obscurity factor, Np=max(Po,Pd)+mean(Po,Pd). The final routing priority list may then be sorted in descending priority order and the final routing to each node created in an order determined by the sorted final priority routing list using the intermediate priority routing information as a starting point. Each port may be routed individually and not all ports of a given net may be routed before a port of a different net may be routed. The final routing pass may create a set of layout information. The layout information may then be stored in a computer usable medium.

In a different embodiment, two routing passes may be performed, with different routing prioritization calculated for each pass. In the first routing pass, referred to a as a global routing pass, a routing priority, Np, may be calculated for each net using the port obscurity factors of the cell ports, Po, only. For each net, the global routing priority may be calculated as the sum of the port obscurity factors for each port connected to the net (Np=sum(Poi) for i=1 to #nodes). In another embodiment, the global routing priority for a net may be calculated as the sum of the port obscurity factors divided by the number of ports in the net (Np=sum(Poi)/(#nodes) for i=1 to #nodes). Once the global routing priority list has been calculated for each net, the list may be sorted in descending priority order and the priority aware global router may route each net in priority order to an incomplete level of detail to create global routing information. For the next routing pass, or detailed routing pass, a detailed routing priority list may be created by calculating a detailed routing priority for each net in the netlist. The detailed routing priority for a net may be calculated as the largest port obscurity factor for the nodes in the net (Np=max(Poi) for i=1 to #nodes). The detailed routing priority list may then be sorted in descending priority order and the nets completely routed in an order determined by the sorted detailed priority routing list using the global priority routing information as a starting point to create a set of layout information. The layout information may then be stored in a computer usable medium.

Figure 6:
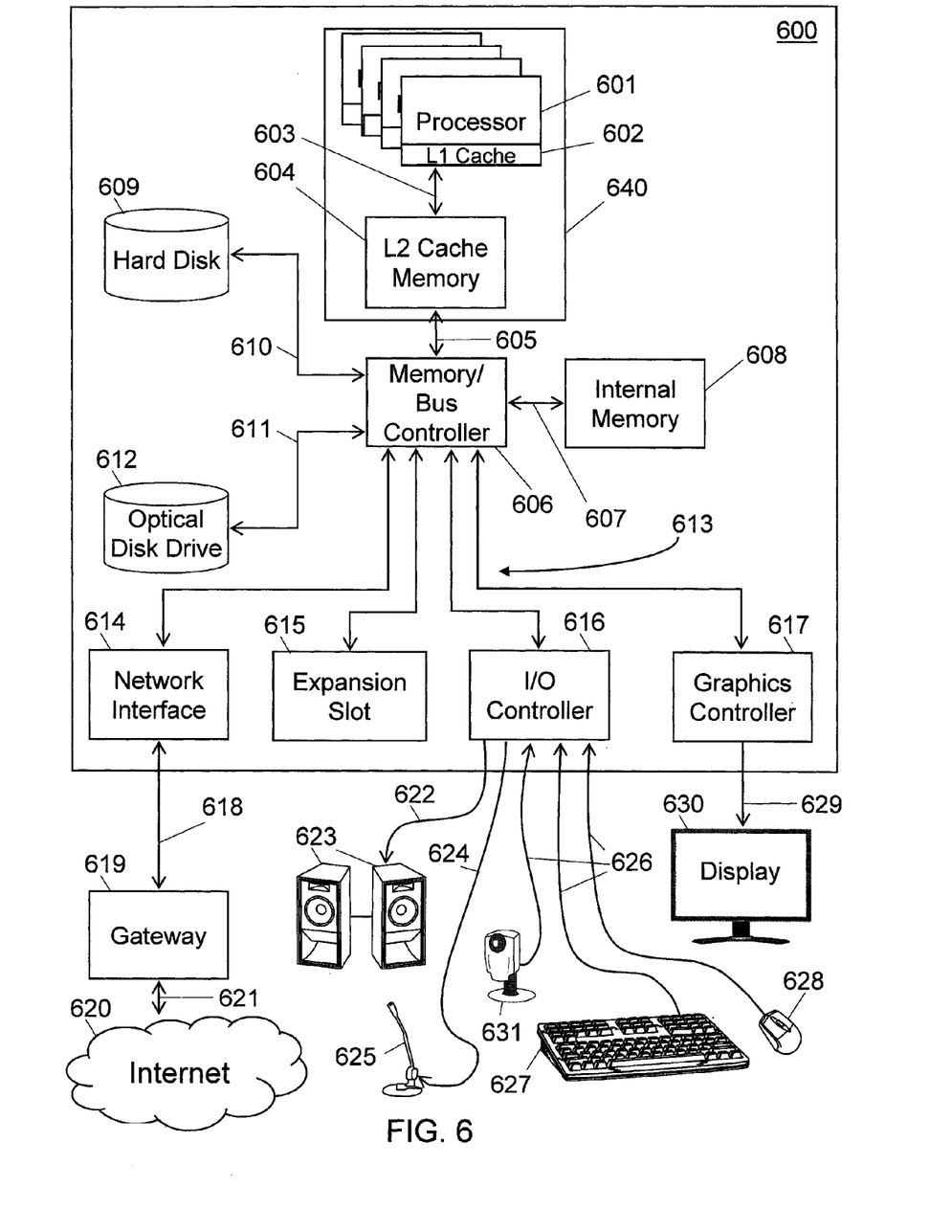
FIG. 6 depicts an embodiment of a computer system suitable various embodiments.

FIG. 6 depicts details of a computer system 600 suitable for implementing various embodiments. The computer system 600 may be configured in the form of a desktop computer, a laptop computer, a mainframe computer, or any other hardware or logic arrangement capable of being programmed or configured to carry out instructions. In some embodiments the computer system 600 may act as a server, accepting inputs from a remote user over a local area network (LAN) 618 or the internet 620. In other embodiments, the computer system 600 may function as a smart user interface device for a server on a LAN 618 or over the internet 620. The computer system 600 may be located and interconnected in one location, or may be distributed in various locations and interconnected via communication links such as a LAN 618 or a wide area network (WAN), via the Internet 620, via the public switched telephone network (PSTN), a switching network, a cellular telephone network, a wireless link, or other such communication links. Other devices may also be suitable for implementing or practicing the embodiments, or a portion of the embodiments. Such devices include personal digital assistants (PDA), wireless handsets (e.g., a cellular telephone or pager), and other such electronic devices preferably capable of being programmed to carry out instructions or routines. One skilled in the art may recognize that many different architectures may be suitable for the computer system 600, but only one typical architecture is depicted in FIG. 6.

Computer system 600 may include a processor 601 which may be embodied as a microprocessor, two or more parallel processors as shown in FIG. 6, a central processing unit (CPU) or other such control logic or circuitry. The processor 601 may be configured to access a local cache memory 602, and send requests for data that are not found in the local cache memory 602 across a cache bus 604 to a second level cache memory 604. Some embodiments may integrate the processor 601, and the local cache 602 onto a single integrated circuit and other embodiments may utilize a single level cache memory or no cache memory at all. Other embodiments may integrate multiple processors 601 onto a single die and/or into a single package. Yet other embodiments may integrate multiple processors 601 with multiple local cache memories 602 with a second level cache memory 604 into a single package 640 with a front side bus 605 to communicate to a memory/bus controller 606. The memory/bus controller 606 may accept accesses from the processor(s) 601 and direct them to either the internal memory 608 or to the various input/output (I/O) busses 610, 611, 613. Some embodiments of the computer system 600 may include multiple processor packages 640 sharing the front-side bus 605 to the memory/bus controller. Other embodiments may have multiple processor packages 640 with independent front-side bus connections to the memory/bus controller. The memory bus controller may communicate with the internal memory 608 using a memory bus 607. The internal memory 608 may include one or more of random access memory (RAM) devices such as synchronous dynamic random access memories (SDRAM), double data rate (DDR) memories, or other volatile random access memories. The internal memory 608 may also include non-volatile memories such as electrically erasable/programmable read-only memory (EEPROM), NAND flash memory, NOR flash memory, programmable read-only memory (PROM), read-only memory (ROM), battery backed-up RAM, or other non-volatile memories. In some embodiments, the computer system 600 may also include $3^{rd}$ level cache memory or a combination of these or other like types of circuitry configured to store information in a retrievable format. In some implementations the internal memory 608 may be configured as part of the processor 601, or alternatively, may be configured separate from it but within the same package 640. The processor 601 may be able to access internal memory 608 via a different bus or control lines than is used to access the other components of computer system 600.

The computer system 600 may also include, or have access to, one or more hard drives 609 (or other types of storage memory) and optical disk drives 612. Hard drives 609 and the optical disks for optical disk drives 612 are examples of machine readable (also called computer readable) mediums suitable for storing the final or interim results of the various embodiments. The optical disk drives 612 may include a combination of several disc drives of various formats that can read and/or write to removable storage media (e.g., CD-R, CD-RW, DVD, DVD-R, DVD-W, DVD-RW, HD-DVD, Blu-Ray, and the like). Other forms or computer readable media that may be included in some embodiments of computer system 600 include, but are not limited to, floppy disk drives, 9-track tape drives, tape cartridge drives, solid-state drives, cassette tape recorders, paper tape readers, bubble memory devices, magnetic strip readers, punch card readers or any other type or computer useable storage medium. The computer system 600 may either include the hard drives 609 and optical disk drives 612 as an integral part of the computer system 600 (e.g., within the same cabinet or enclosure and/or using the same power supply), as connected peripherals, or may access the hard drives 609 and optical disk drives 609 over a network, or a combination of these. The hard drive 609 often includes a rotating magnetic medium configured for the storage and retrieval of data, computer programs or other information. In some embodiments, the hard drive 609 may be a solid state drive using semiconductor memories. In other embodiments, some other type of computer useable medium may be used. The hard drive 609 need not necessarily be contained within the computer system 600. For example, in some embodiments the hard drive 609 may be server storage space within a network that is accessible to the computer system 600 for the storage and retrieval of data computer programs or other information. In some instances the computer system 600 may use storage space at a server storage farm, or like type of storage facility, that is accessible by the Internet 620 or other communications lines. The hard drive 609 is often used to store the software, instructions and programs executed by the computer system 600, including for example, all or parts of the computer application program for carrying out activities of the various embodiments.

Communication links 610, 611 may be used to access the contents of the hard drives 609 and optical disk drives 612. The communication links 610, 611 may be point-to-point links such as Serial Advanced Technology Attachment (SATA) or a bus type connection such as Parallel Advanced Technology Attachment (PATA) or Small Computer System Interface (SCSI), a daisy chained topology such as IEEE-1394, a link supporting various topologies such as Fibre Channel, or any other computer communication protocol, standard or proprietary, that may be used for communication to computer readable medium. The memory/bus controller may also provide other I/O communication links 613. In some embodiments, the links 613 may be a shared bus architecture such as peripheral component interface (PCI), microchannel, industry standard architecture (ISA) bus, extended industry standard architecture (EISA) bus, VERSAmodule Eurocard (VME) bus, or any other shared computer bus. In other embodiments, the links 613 may be a point-to-point link such as PCI-Express, HyperTransport, or any other point-to-point 110 link. Various I/O devices may be configured as a part of the computer system 600. In many embodiments, a network interface 614 may be included to allow the computer system 600 to connect to a network 618. The network 618 may be an IEEE 802.3 ethernet network, an IEEE 802.11 Wi-Fi wireless network, or any other type of computer network including, but not limited to, LANs, WAN, personal area networks (PAN), wired networks, radio frequency networks, powerline networks, and optical networks. A network gateway 619 or router, which may be a separate component from the computer system 600 or may be included as an integral part of the computer system 600, may be connected to the network 618 to allow the computer system 600 to communicate with the internet 620 over an internet connection 621 such as an asymmetric digital subscriber line (ADSL), data over cable service interface specification (DOCSIS) link, T1 or other internet connection mechanism. In other embodiments, the computer system 600 may have a direct connection to the internet 620. In some embodiments, an expansion slot 615 may be included to allow a user to add additional functionality to the computer system 600.

The computer system 600 may include an I/O controller 616 providing access to external communication interfaces such as universal serial bus (USB) connections 626, serial ports such as RS-232, parallel ports, audio in 625 and audio out 622 connections, the high performance serial bus IEEE-1394 and/or other communication links. These connections may also have separate circuitry in some embodiments, or may be connected through a bridge to another computer communication link provided by the I/O controller 616. A graphics controller 617 may also be provided to allow applications running on the processor 601 to display information to a user. The graphics controller 617 may output video through a video port 629 that may utilize a standard or proprietary format such as an analog video graphic array (VGA) connection, a digital video interface (DVI), a digital high definition multimedia interface (HDMI) connection, or any other video connection. The video connection 629 may connect to display 630 to present the video information to the user. The display 630 may be any of several types of displays, including a liquid crystal display (LCD), a cathode ray tube (CRT) monitor, on organic light emitting diode (OLED) array, or other type of display suitable for displaying information for the user. The display 630 may include one or more light emitting diode (LED) indicator lights, or other such display devices. Typically, the computer system 600 includes one or more user input/output (I/O) devices such as a keyboard 627, mouse 628, and/or other means of controlling the cursor represented including but not limited to a touchscreen, touchpad, joystick, trackball, tablet, or other device. The user I/O devices may connect to the computer system 600 using USB 626 interfaces or other connections such as RS-232, PS/2 connector or other interfaces. Some embodiments may include webcam 630 which may connect using USB 626, a microphone 625 connected to an audio input connection 624 and/or speakers 623 connected to an audio output connection 622. The keyboard 627 and mouse 628, speakers 623, microphone 625, webcam 631, and monitor 630 may be used in various combinations, or separately, as means for presenting information to the user and/or receiving information and other inputs from a user to be used in carrying out various programs and calculations. Speech recognition software may be used in conjunction with the microphone 625 to receive and interpret user speech commands.

The computer system 600 may be suitable for use in routing an integrated circuit using priority based on port obscurity factors. For example, the processor 601 may be embodied as a microprocessor, microcontroller, DSP, RISC processor, two or more parallel processors, or any other type of processing unit that one of ordinary skill would recognize as being capable of performing or controlling the functions, activities and methods described herein. A processing unit in accordance with at least one of the various embodiments can operate computer software programs stored (embodied) on computer-readable medium such those compatible with the disk drives 609, the optical disk drive 612 or any other type of hard disk drive, floppy disk, flash memory, ram, or other computer readable medium as recognized by those of ordinary skill in the art.

As will be appreciated by those of ordinary skill in the art, aspects of the various embodiments may be embodied as a system, method or computer program product. Accordingly, aspects of the present invention may take the form of an entirely hardware embodiment, an entirely software embodiment (including firmware, resident software, micro-code, or the like) or an embodiment combining software and hardware aspects that may all generally be referred to herein as a "circuit," "module," "logic" or "system." Furthermore, aspects of the various embodiments may take the form of a computer program product embodied in one or more computer readable medium(s) having computer readable program code stored thereon.

Any combination of one or more computer readable medium(s) may be utilized. The computer readable medium is typically a computer readable storage medium. A computer readable storage medium may be embodied as, for example, an electronic, magnetic, optical, electromagnetic, infrared, or semiconductor system, apparatus, or device, or other like storage devices known to those of ordinary skill in the art, or any suitable combination of the foregoing. Examples of such computer readable storage medium include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of the present invention may be written in any combination of one or more programming languages, including an object oriented programming language such as Java, Smalltalk, C++, or the like, and conventional procedural programming languages, such as the "C" programming language or similar programming languages. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and/or block diagrams in the figures help to illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including" used in this specification specify the presence of stated features, integers, steps, operations, elements, and/or components, but do not preclude the presence or addition of one or more other features, integers, steps, operations, elements, components, and/or groups thereof. The term "obtaining", as used herein and in the claims, may mean either retrieving from a computer readable storage medium, receiving from another computer program, receiving from a user, calculating based on other input, or any other means of obtaining a datum or set of data. The term "plurality", as used herein and in the claims, means two or more of a named element; it should not, however, be interpreted to necessarily refer to every instance of the named element in the entire device. Particularly, if there is a reference to "each" element of a "plurality" of elements, there may be additional elements in the entire device that may not be included in the "plurality" and are not, therefore, referred to by "each."

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and gist of the invention. The various embodiments included herein were chosen and described in order to best explain the principles of the invention and the practical application, and to enable others of ordinary skill in the art to understand the invention for various embodiments with various modifications as are suited to the particular use contemplated.

What is claimed is:

1. A method, executed on a processor, to design an integrated circuit, the method comprising:
    retrieving a netlist from a machine readable medium accessible by the processor, wherein the netlist includes at least a first net and a second net;
    obtaining a set of cell instances for the integrated circuit, including cell instances connected to the first net and cell instances connected to the second net;
    extracting, from the netlist, a first list of ports of the set of cell instances to be connected together in the first net;

extracting from the netlist a second list of ports of the set of cell instances to be connected together in the second net;

calculating port obscurity factors, including a first set of port obscurity factors for the first list of ports of the set of cell instances and a second set of port obscurity factors for the second list of ports of the set of cell instances, based, at least in part, on a number of routing tracks that are connectable to a particular port, by subtracting fractional shares of the routing tracks connectable to the particular port of a cell from a predetermined constant, wherein a calculation of a fractional share is inversely proportional to a number of ports of the cell that are connectable to a routing track;

calculating, on the processor, a first routing priority based on the first set of port obscurity factors;

calculating, on the processor, a second routing priority based on the second set of port obscurity factors; and storing information based on the first routing priority and the second routing priority on a computer usable medium.

2. The method of claim 1, wherein the information based on the first routing priority and the second routing priority includes the first routing priority with an association with the first net, and the second routing priority with an association with the second net.

3. The method of claim 1, further comprising:
routing the first net and the second net in an order based on the first routing priority and the second routing priority to create layout information;
wherein the information based on the first routing priority and the second routing priority includes the layout information.

4. The method of claim 1, wherein other ports of the cell that are more than one layer away from the routing track are not included as connectable to the routing track in the calculation of the fractional share.

5. The method of claim 1, wherein local routing tracks entering the cell from all four sides, and non-local routing tracks entering the cell in a normal routing direction are included in the calculation of the port obscurity factor.

6. A computer program product to design an integrated circuit, the computer program product comprising:
a non-transitory computer readable storage medium having computer readable program code embodied therewith, the computer readable program code comprising:
computer readable program code configured to retrieve a netlist from a machine readable medium accessible by the processor, wherein the netlist includes at least a first net and a second net;
computer readable program code configured to obtain a set of cell instances for the integrated circuit, including cell instances connected to the first net and cell instances connected to the second net;
computer readable program code configured to extract, from the netlist, a first list of ports of the set of cell instances to be connected together in the first net;
computer readable program code configured to extract from the netlist a second list of ports of the set of cell instances to be connected together in the second net;
computer readable program code configured to calculate port obscurity factors, including a first set of port obscurity factors for the first list of ports of the set of cell instances and a second set of port obscurity factors for the second list of ports of the set of cell instances, based, at least in part, on a number of routing tracks that are connectable to a particular port, by subtracting fractional shares of the routing tracks connectable to the particular port of a cell from a predetermined constant, wherein a calculation of a fractional share is inversely proportional to a number of ports of the cell that are connectable to a routing track;
computer readable program code configured to calculate a first routing priority based on the first set of port obscurity factors;
computer readable program code configured to calculate a second routing priority based on the second set of port obscurity factors; and
computer readable program code configured to store information based on the first routing priority and the second routing priority on a computer usable medium.

7. The computer program product of claim 6, wherein the information based on the first routing priority and the second routing priority includes the first routing priority with an association with the first net, and the second routing priority with an association with the second net.

8. The computer program product of claim 6, the computer readable program code further comprising:
computer readable program code configured to route the first net and the second net in an order based on the first routing priority and the second routing priority to create layout information;
wherein the information based on the first routing priority and the second routing priority includes the layout information.

9. The computer program product of claim 6, wherein other ports of the cell that are more than one layer away from the routing track are not included as connectable to the routing track in the calculation of the fractional share.

10. The computer program product of claim 6, wherein local routing tracks entering the cell from all four sides, and non-local routing tracks entering the cell in a normal routing direction are included in the calculation of the port obscurity factor.

* * * * *